(12) United States Patent
Rubner et al.

(10) Patent No.: US 6,548,836 B1
(45) Date of Patent: Apr. 15, 2003

(54) SOLID STATE LIGHT-EMITTING DEVICE

(75) Inventors: Michael F. Rubner, Westford, MA (US); Erik S. Handy, Cincinnati, OH (US); Amlan J. Pal, Calcutta (IN)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 09/303,101

(22) Filed: Apr. 29, 1999

(51) Int. Cl.$^7$ .............................................. H01L 33/00
(52) U.S. Cl. ...................... 257/103; 257/40; 257/613; 257/82; 428/917; 428/690
(58) Field of Search .................... 257/40, 103, 613, 257/82; 428/917, 690

(56) References Cited

U.S. PATENT DOCUMENTS

| | | | |
|---|---|---|---|
| 3,900,418 A | | 8/1975 | Bard et al. |
| 5,075,172 A | | 12/1991 | Dixon et al. |
| 5,275,967 A | * | 1/1994 | Taniguchi et al. .......... 437/127 |
| 5,324,457 A | | 6/1994 | Zhang et al. |
| 5,677,546 A | | 10/1997 | Yu |
| 5,682,043 A | | 10/1997 | Pei et al. |
| 5,727,289 A | | 2/1998 | Tanaka |
| 5,861,219 A | | 1/1999 | Thompson et al. |
| 5,958,573 A | * | 9/1999 | Spitler et al. ............... 428/323 |

OTHER PUBLICATIONS

Aiping Wu et al. "Light emitting electrochemical devices from sequentially absorbed multilayers of a polymeric ruthenium (II) complex and various polyanions", Thin Solid Films 327–329, 1998, 663–667.

C. Michael Elliott et al."Highly Efficient Solid–State Electrochemically Generated Chemiluminescence from Ester –Substituted Trisbipyridineruthenium(II)–Based Polymers", J. Am. Chem. Soc. 1998, 120, 6781–6784.

Yuguang Ma et al., "Electroluminescence from triplet metal–ligand charge–transfer excited state of transition metal complexes", Synthetic Metals 94 245–248, 1998.

Karolyn M. Maness et al., "Solid State Electrochemically Generated Luminescence Based on Serial Frozen Concentration Gradients . . . ", J.Am. Chem. Society, vol. 119, No. 17, 1997.

Aipung Wu et al., "Electrochemically Based Light Emitting Devices From Sequentially Absorbed Multilayers of a Polymeric Ruthenium (II) Complex and Poly(Acrylic Acid)", Materials Research Soc., vol. 488, 1998.

Eric S. Handy et al., "Solid–State Light–Emitting Devices Based on the Tris–Chelated Ruthenium(II) Complex. 2. Tris (bipyridyl) ruthenium(II) as a High–Brightness Emitter", American Chemical Society, p. est 3.9, 1998.

J.K. Lee et al., "Thin film light emitting devices from an electroluminescent ruthenium complex", American Institute of Physics, 1996.

Jin–Kyu Lee et al., "Synthesis and Characterization of an Electroluminescent Polyester Containing the Ru(II) Complex", Chemistry of Materials, vol. 9, No. 8, pp. 1710–1712, 1997.

Dongsik Yoo et al., "New Electro–Acive Self–Assembled Multilayer Thin Films Based On Alternately Adsorbed Layers of Polyelectrolytes and Functional Dye Molecules", Synthetic Metals 85 1425–1426, 1997.

(List continued on next page.)

Primary Examiner—Eddie Lee
Assistant Examiner—N. Drew Richards
(74) Attorney, Agent, or Firm—Fish & Richardson P.C.

(57) ABSTRACT

A solid state light-emitting device having a high maximum luminance, a high external efficiency, and a low operating voltage is described. The device can include a solid layer, a first inert electrode, and a second inert electrode. The solid layer includes a metal complex and has a first surface and a second surface. The first inert electrode contacts the first surface of the solid layer. The second inert electrode contacts the second surface of the solid layer. The device can have a luminance of at least 50 cd/m$^2$ at a potential of between 2.5 and 5.0 V.

42 Claims, 7 Drawing Sheets

OTHER PUBLICATIONS

Karolyn M. Maness et al., "Solid–State Diode–like Chemiluminescence Based on Serial, Immobilized Concentration Gradients...", J.Am. Chem. Soc 118, 10609–10616, 1996.

Erik S. Handy et al., "Development of the tris–chelated polypyridyl ruthenium (II) complex as a solid–state light emitter", SPIE vol. 3476, 1998.

C.H. Lyons et al., "Solid–State Light–Emitting Devices Based on the Trischelated Ruthenium (II) Complex. 1. Thin Film Blends with Poly(ethylene oxide)", J. Amer. Chem. Soc. vol. 120, No. 46, 1998.

Burroughes, J. H. et al., "Light–emitting diodes based on conjugated polymers", Nature, vol. 347, pp. 539–541, (1990).

Greenham, Niel et al., "Angular Dependence of the Emission from a Conjugated Polymer Light–Emitting Diode: Implications for Efficiency Calculations", Advanced Materials, vol. 6. No. 6, pp. 491–494, (1994).

Huang, M. B. et al., "Suppression of penetration of aluminium into 8–hydroxyquinoline aluminum via thin oxide barrier", Applied Physics Letters, vol. 73, No. 20, pp. 2914–2916, (1998).

Nagai, Keiji et al., "Molecular distribution of photoluminescent Ru(bpy)32+ dispersed in a polymer film and its distance–dependent concentration quenching", J. Photochem, Photobiol. A Chem., vol. 84, pp. 271–277, (1994).

Pei, Qibing et al., "Polymer Light–Emitting Electrochemical Cells", Science, vol. 269, pp. 1086–1088, (1995).

Tang C. W. and VanSlyke, A., "Organic electroluminescent diodes", Appl. Phys. Lett., vol. 51, No. 12, pp. 913–915, (1987).

* cited by examiner

I

II

III

IV

SOLID STATE LIGHT-EMITTING DEVICE

This invention was made with government support under Grant Numbers N00014-91-J-1381 and N00014-95-1-1291 awarded by the Department of the Navy and Grant Number DMR-9400334 awarded by the National Science Foundation. The government has certain rights in the invention.

BACKGROUND OF THE INVENTION

The invention relates to a solid state light-emitting device.

Light emitting devices can be used, for example, in displays (e.g., flat-panel displays), screens (e.g., computer screens), and other items that require illumination. Accordingly, the brightness of the light emitting device is one important feature of the device. Also, low operating voltages and high efficiencies can improve the viability of producing emissive devices.

Light emitting devices can release photons in response to excitation of an active component of the device. Emission can be stimulated by applying a voltage across the active component (e.g., an electroluminescent component) of the device. The electroluminescent component can be a polymer, such as a conjugated organic polymer or a polymer containing electroluminescent moieties or layers of organic molecules. Typically, the emission can occur by radiative recombination of a trapped charge between layers of a device.

The energy of the emitted light can correspond to the energy difference between bands, i.e., between the ground state and excited state of the materials. The emitted light has an emission profile that includes a maximum emission wavelength, and an emission intensity, measured in luminance (candelas/meter$^2$; cd/m$^2$). The emission profile, and other physical characteristics of the device, can be altered by the electronic structure (e.g., energy gaps) of the material. For example, the brightness, range of color, efficiency, operating voltage, and operating lifetimes of light emitting devices can vary based on the structure of the device.

SUMMARY OF THE INVENTION

In general, the invention features a solid state light-emitting device having a high maximum luminance, a high external efficiency, and a low operating voltage.

In one aspect, the invention features a solid state light-emitting device. The device includes a solid layer, a first inert electrode, and a second inert electrode. The solid layer includes a metal complex and has a first surface and a second surface. The first inert electrode contacts the first surface of the solid layer. The second inert electrode contacts the second surface of the solid layer. The device has a luminance of at least 50 cd/m$^2$ at a potential of between 2.5 and 5.0 V.

In another aspect, the invention features a solid state light emitting device including a solid layer consisting essentially of a ruthenium bipyridine complex.

In another aspect, the invention features a solid state light emitting device including a solid layer. The solid layer includes a non-polymeric metal bipyridine complex and the device has a luminance of at least 50 cd/m$^2$ at a potential of between 2.5 and 5.0 V.

In certain embodiments, the device can have a luminance of at least 100 cd/m$^2$ (e.g., at least 200 cd/m$^2$ or at least 1000 cd/m$^2$) at a potential of between 2.5 and 5.0 V. The device can have an intensity drop to one-half of a maximum intensity at 2.8 V of at least 5 hours (e.g., at least 20 hours, or at least 50 hours). The device can have an external efficiency of at least 0.3 percent (e.g., at least 0.5 percent or at least 0.75 percent).

The metal complex can be non-polymeric. The metal can be ruthenium or osmium. The metal complex can be a transition metal complex, such as a hexafluorophosphate salt of a ruthenium bipyridine complex. In certain embodiments, the metal complex is a bipyridine complex. The bipyridine can have a hydroxymethyl substituent, a $C_{1-18}$ alkoxycarbonyl substituent, or a hydroxy substituent, or combinations thereof.

Each inert electrode can be selected from a group consisting of indium tin oxide, a metal, such as aluminum, silver, gold, platinum, or palladium, and a conducting polymer, such as polypyrrole. In certain embodiments, the first inert electrode can be selected from a group consisting of indium tin oxide, aluminum, silver, gold, platinum, and palladium. The second inert electrode can be selected from a group consisting of indium tin oxide, silver, gold, platinum, palladium, and polypyrrole.

In yet another aspect, the invention features a method of generating light. The method includes applying a light-generating potential of between 2.5 and 5.0 V across a first inert electrode and a second inert electrode of a solid state light-emitting device, and generating light from the device having a luminance of at least 50 cd/m$^2$. The device includes a solid layer, a first inert electrode, and a second inert electrode. The solid layer includes a metal complex and has a first surface and a second surface. The first inert electrode contacts the first surface of the solid layer. The second inert electrode contacts the second surface of the solid layer. The method can further include the step of applying a charging potential of greater than 5.0 V for less than 30 seconds prior to applying the light-generating potential.

In another aspect, the invention features a method of manufacturing a solid state light-emitting device. The method includes depositing a solid layer including a metal complex onto a first inert electrode, and placing a second inert electrode onto the solid layer, avoiding contact with said first inert electrode. The device has a luminance of at least 50 cd/M$^2$ at a potential of between 2.5 and 5.0 V. The solid layer can be deposited, for example, by spin coating a solution on a surface of the first electrode.

The solid state light-emitting device based on a solid layer of a metal complex exhibits good air stability, high efficiency, and high luminance, and operates at low voltages. In addition, device fabrication and operation are straightforward and simple. In fact, low cost fabrication techniques, such as spin coating, can be utilized to make the devices.

For example, the solid state light-emitting device based on a Ru(II) complex can be activated to high brightness without elaborate film fabrication or charging schemes, such as solvent-swelling. In addition, reactive cathode materials (e.g., Ca, Mg) are not needed, and additional electrolyte materials are not added to the solid layer. In fact, red-orange or red luminance of at least 50 cd/m$^2$ is unprecedented in neat films of non-polymeric emitters at 2.5 to 5V. For example, at 2.5V, a device based on compound I, shown in FIG. 2, operates with a luminous efficacy of 1.4 lm/W (0.6 cd/A), making the material attractive for flat-panel display applications.

The low operating voltage of the solid state light-emitting device allows an applied bias close to the redox potential of the emitter to be used. The low voltage is sufficient to both induce counter-ion migration and effect the required redox reactions to generate light from the solid layer. At slightly higher voltages, charging times decrease dramatically. By applying a high voltage for a brief amount of time, followed by normal operation at low voltage, the charging time of the device can be significantly reduced. Alternative biasing schemes, such as imposing an alternating current field over a dc bias, can extend device lifetime several-fold at comparable brightness, Other devices having a multiple layer structure include at least two thin organic layers (i.e., a hole transporting layer, and an electron transporting layer) separating the anode and cathode of the device. This device operates like a diode with a forward bias when the potential applied to the anode is higher than the potential applied to the cathode. Light emitted from such a layered device depends on the direction of the applied bias and the electrode materials, The single solid layer device of the invention can emit light under any bias direction. In addition, the single solid layer device of the invention can employ a variety of inert electrode materials.

Other features or advantages of the present invention will be apparent from the following detailed description and also from the claims.

DETAILED DESCRIPTION

Figure 1:
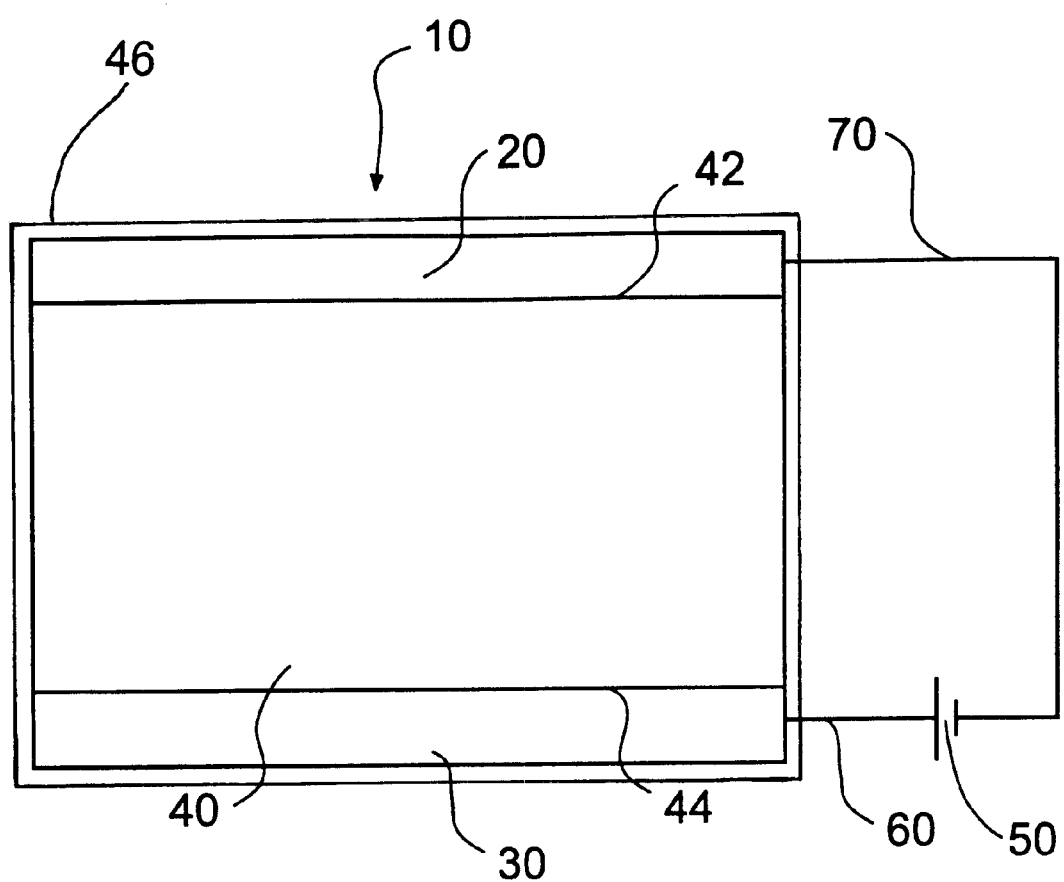
FIG. 1 is a schematic drawing depicting a light emitting device.

Referring to FIG. 1, light emitting device 10 includes first inert electrode 20, second inert electrode 30, and solid layer 40. Solid layer 40 includes a metal complex. Solid layer 40 has first surface 42 in contact with first inert electrode 20. Solid layer 40 also has second surface 44 in contact with second inert electrode 30. First inert electrode 20 and second inert electrode 30 are connected to voltage source 50 by electrical conductor 60 and electrical conductor 70. When a potential of between 2.5 and 5.0 V is applied by voltage source 50, the device has a luminance of at least 50 cd/m$^2$.

For example, when solid layer 40 is a spin-cast film of a bipyridine complex of ruthenium, electrode 20 is an aluminum electrode, and electrode 30 is an indium-tin-oxide electrode (ITO), the device can exhibit luminance levels as high as about 1000 cd/m$^2$ at 5V and more than 200 cd/m$^2$ at 3V. In addition, external quantum efficiencies of at least about 0.5 percent (e.g., about 1 percent) can be realized at low voltages (e.g., around 3V). Accordingly, devices can be prepared that achieve high brightnesses and efficiencies at near-redox potentials of the ruthenium complexes (2.5–3.0V). The low operating voltage can improve the operating lifetimes of the devices.

The metal complex of solid layer 40 is electroluminescent. The metal complex can be a salt composed of a cation metal complex and an anion. The metal complex includes a metal ion and one or more ligands. For example, the metal complex can be a redox active metal complex having a conjugated ligand. One example of a suitable metal complex is a ruthenium complex. The ligands of the ruthenium complex can be pyridine-based ligands, such as bipyridine ligands and derivatives thereof (e.g., 4,4' disubstituted-2,2'-bipyridine compounds). In certain embodiments, the ruthenium complex can be of the formula Ru(L)$_3^{2+}$, where each L, independently, can be selected from the following: 2,2'-bipyridine (bpy), 4,4' bis(hydroxymethyl)-2,2'-bipyridine, 4,4'-bis(carboxy)-2,2'-bipyridine, $C_1$–$C_{18}$ alkyl esters of 4,4'-bis(carboxy)-2,2'-bipyridine, or 4,4'-bis(hydroxy)-2,2'-bipyridine. The electronic nature of the ligand can alter the emission properties of the device. For example, electron withdrawing groups tend to shift the emission wavelength to longer wavelengths.

The anion is electrochemically inert. The anion does not react with oxygen, the electrode materials, or the metal under the applied operating voltage. The anion can be a phosphate or borate. Examples of suitable anions include hexafluorophosphate (PF$_6^-$), tetrafluoroborate (BF$_4^-$), and perchlorate (ClO$_4^-$). The anion of the metal complex can be changed, for example, by anion metathesis.

Figure 2:
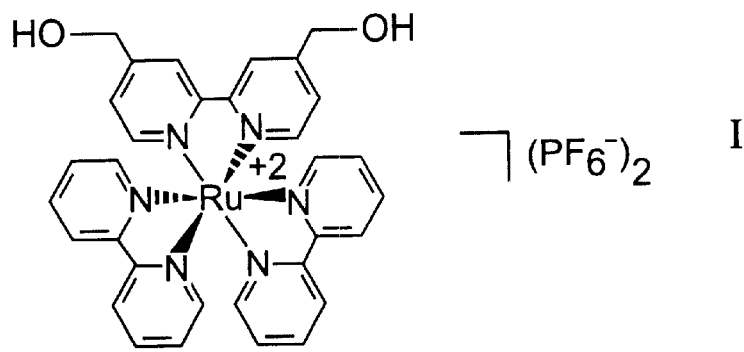
FIG. 2 is a schematic drawing depicting four compounds, each of which can be used in a light emitting device.
Figure 2:
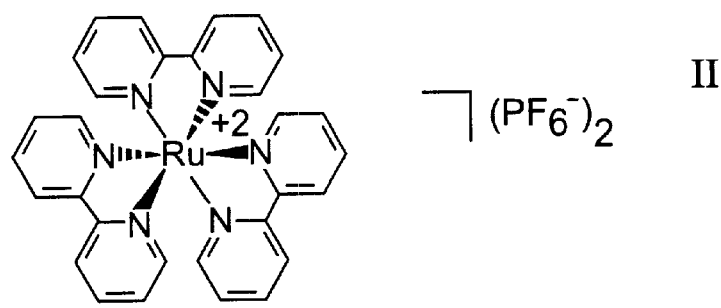
Figure 2:
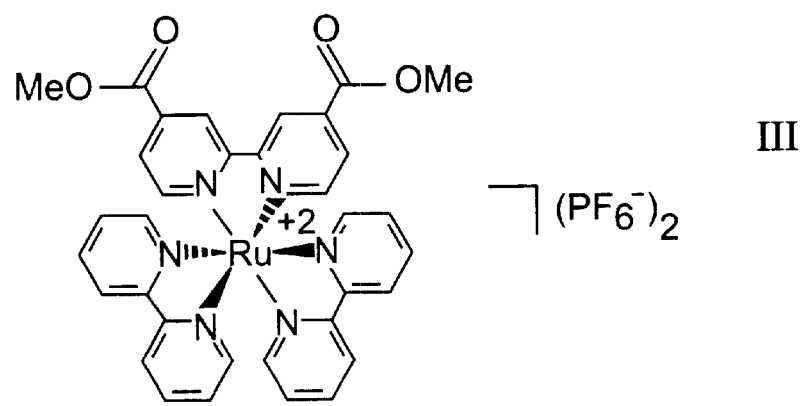
Figure 2:
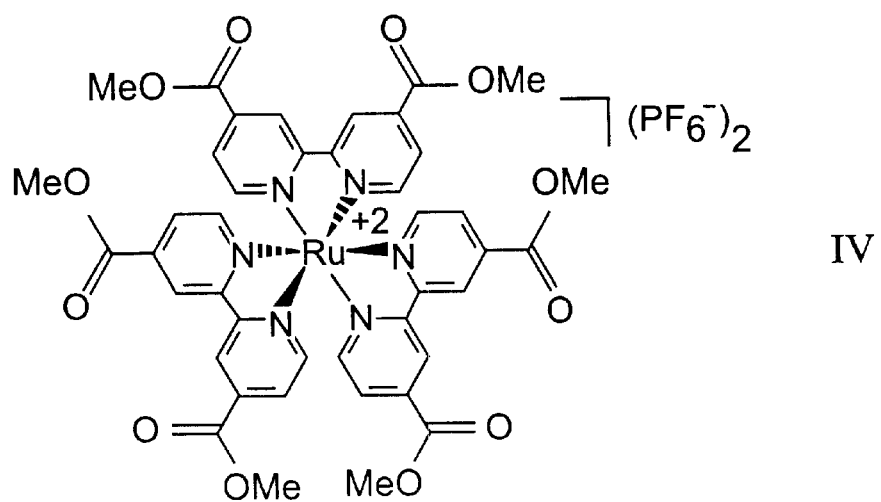

Ruthenium bipyridine complexes can be prepared using ordinary ligand substitution reactions. The synthesis of substituted bipyridines and ruthenium complexes containing bipyridine ligands is described, for example, in Lee, et al. *Chemistry of Materials,* 9:1710–1712 (1997). Examples of metal complexes useful in forming the solid layer of the light emitting device are compounds I, II, III, and IV, the structures of which are shown in FIG. 2.

The wavelength of maximum emission from the light emitting device can be between 600 and 700 nm. The intensity of the maximum emission decreases with time. The drop to one half of the maximum emission is related to the lifespan of the device. The time to drop to one half of the maximum emission intensity ($t_{1/2}$) can be at least 1.5 hours (e.g., at least 100 hours). In certain embodiments, the $t_{1/2}$ can be at least 250 hours.

The external quantum efficiency of the light emitting device can be greater than 0.5 percent. In certain embodiments, the external quantum efficiency can be about 1 percent. An optical power meter can be used to measure light output (e.g., a Newport 1830C optical power meter). By dividing by a factor of between 30 and 36, the optical power output, measured in nanowatts, can be converted to luminance (cd/m$^2$). The conversion factor can be determined for the particular experimental set-up in use by comparing power output measurements to direct luminance measurements. Luminance values can be determined using a Graseby Optronics (Orlando, Fla.) S370 optometer.

The external efficiency is defined as the ratio of emitted light intensity to current flow (e.g., photons out/electrons in). Calculation of external quantum efficiency values has been described previously by Lyons et al., *J. Am. Chem. Soc.* 120:12100–12107 (1998). Briefly, light emission from the front face of the device is taken to be Lambertian, and the light is collected over emission angles 0 to 21° by a photodiode. The measured power output is corrected for losses due to waveguiding The external efficiency, $\eta_{ext}(\%)$, is calculated as follows:

$$\eta_{ext}(\%) = (P/h\nu)/(I/e)$$

where

P=the corrected power output;
h=Planck's constant;
v=the center frequency of the emitted light;
I=the current; and
e=the elementary charge.

Each of the electrodes is composed of a conductive material. The electrode material is inert. The inert electrode material does not react with the material in the solid layer under ambient conditions or when an operating voltage is applied to the device. The inert electrode material also does not substantially react with the atmosphere (e.g., with oxygen in air). The inert electrode material can be a transparent material such as indium tin oxide (ITO), a metal such as aluminum, silver, gold, platinum, or palladium, or a conductive polymer, such as polypyrrole. When one of the electrodes is transparent, such as ITO deposited on glass, the light generated by the device shines through the transparent electrode, illuminating the surface of the electrode.

The solid layer can be deposited on the surface of one of the inert electrodes by spin coating, dip coating, vapor deposition, or other thin film deposition methods. In certain embodiments, a solution of the metal complex in a solvent is deposited by spin coating on a surface of an electrode. For example, a pyridine solution of a ruthenium hexafluorophosphate salt can be deposited by spin coating on an ITO electrode. The resulting solid layer can have a thickness of between about 200 and 2000 Å (e.g., between about 500 and 1500 Å). The device can range from about 2 mm×2 mm to about 20 mm×20 mm in size. Larger devices can also be made.

The second electrode can be sandwiched, sputtered, or evaporated onto the exposed surface of the solid layer. One or both of the electrodes can be patterned. The electrodes of the device are connected to a voltage source by electrically conductive pathways. Upon application of the voltage, light is generated from the device.

In certain embodiments, an increased voltage (i.e., a 1 to 6 V increase over the operating voltage) can be applied for a short duration of time (e.g., less than 10 seconds) prior to holding the device at the operating voltage to decrease charging time. By decreasing charging time, a higher luminance can be more rapidly achieved from a light emitting device. Counter-ion redistribution can be slow at a lower bias, which can lead to longer charging times which can be reduced by employing a higher voltage pulse.

Additives can be included in the solid layer. The additives can be polymers, such as polymethylmethacrylate or polyethylene oxides (e.g., polyethylene glycol or methyl terminated polyethylene oxide), inorganic nanoparticles (e.g., 10–100 Å silica particles), salts (e.g., lithium triflate), or a redox active material that can facilitate charge transfer through the film or that can accept the excited state and emit light of a different wavelength (e.g., a lumophore). In addition, the interface between each electrode and the solid layer can be modified, for example, by depositing a thin polymer coating (e.g., polyethylene imine) on the electrode surface. The device can be encapsulated in a polymer matrix (46 in FIG. 1) that is resistant to oxygen or moisture permeation to increase the lifetime of the light emitting device.

Without further elaboration, it is believed that one skilled in the art can, based on the above disclosure and the examples below, utilize the present invention to its fullest extent. The following examples are to be construed as merely illustrative of how one skilled in the art can practice the invention and do not limit the remainder of the disclosure in any way.

EXAMPLE 1

Light emitting devices based on the hydroxymethyl-functionalized $Ru(bpy)_3^{2+}$, compound I, were prepared. The devices were fabricated in the following way. Indium tin oxide (ITO) was used as the anode. The ITO had been sputtered onto 1 inch ×1 inch glass substrates by Donnelley Applied Films (Holland, Mich.) and patterned into 3 mm wide strips by DCI, Inc. (Olathe, Kans.). The ITO substrates were cleaned by one 10 minute ultrasonication in 2:1 $H_2O$/LYSOL®, followed by three 10 minute ultrasonication steps in $H_2O$ only. The substrates were rinsed with $H_2O$, then air-dried using compressed air. Using a photoresist spinner, five drops of filtered pyridine were spun off of the substrates three times at 7000 rpm for final rinsing. Next, an 800–900 Å thin film of compound I was spin-cast onto the substrates from five drops of a filtered 4% (w/w) pyridine solution. The thickness was measured by profilometry. The solution was spun on at 1500 rpm for 30 seconds. The film was annealed at 100° C. under dynamic vacuum to remove residual pyridine. A 2000 Å-thick aluminum cathode was then thermally-evaporated on top of the film in 1 in.-long, 2-mm-wide strips perpendicular to the ITO strips, defining a light-emitting active area of 6 $mm^2$.

Device testing was performed in a glovebox in a nitrogen environment. The testing was computer-automated using a LabVIEW® (National Instruments, Austin, Tex.) program and performed in a glove box in a nitrogen environment. Power was supplied by a Keithley 230 programmable voltage source. Unless otherwise indicated, devices were ramped to and held at the stated voltage. The voltage sweep rate used was 0.5V/5 sec. Current flow was measured using a Hewlett-Packard 34401A multimeter, and the emitted light intensity measured using a Newport 1830C optical power meter. Luminance values were determined using a Graseby Optronics (Orlando, Fla.) S370 optometer.

Figure 3:
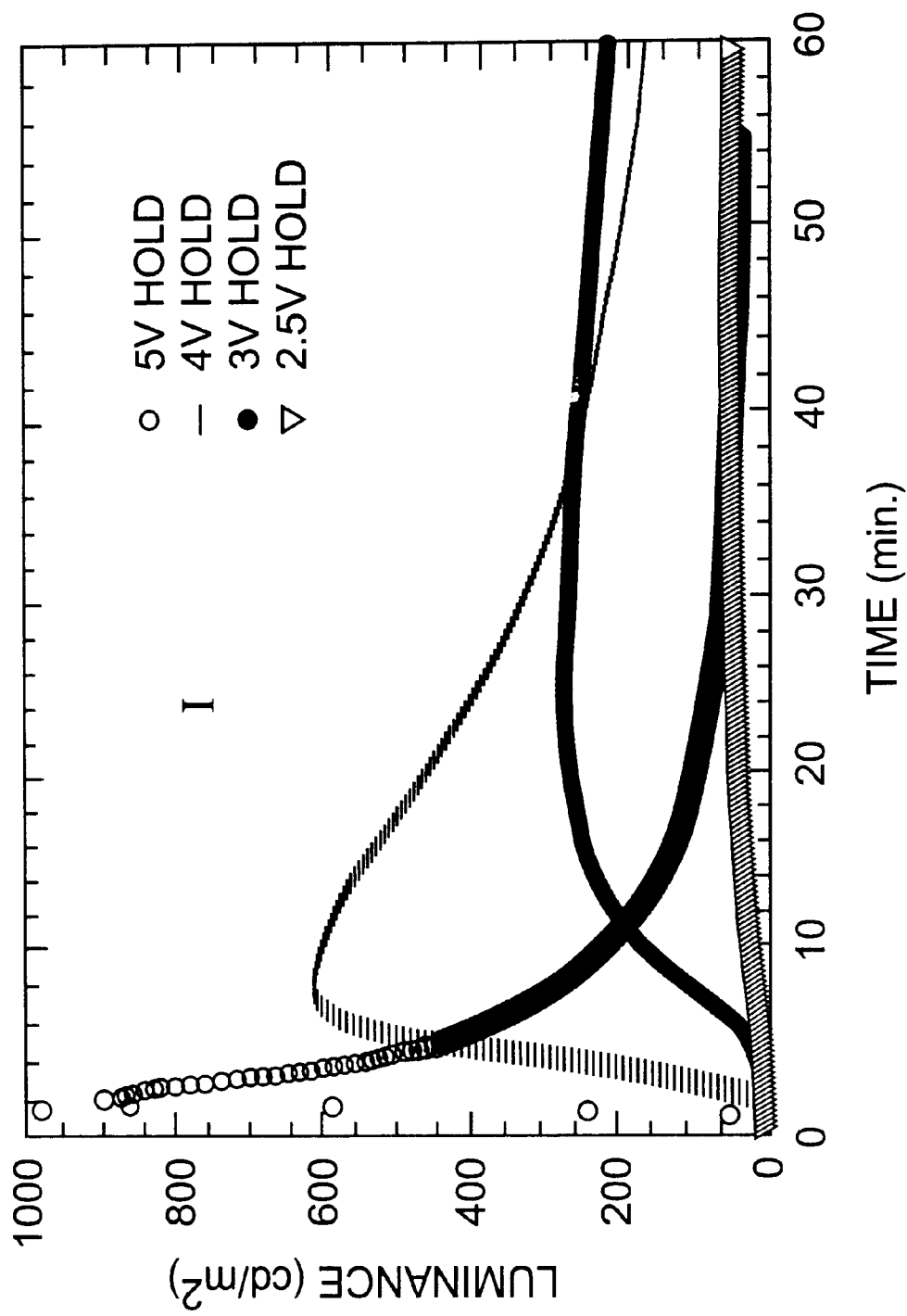
FIG. 3 is a graph depicting light output as a function of time and applied voltage for a device based on compound I.
Figure 4:
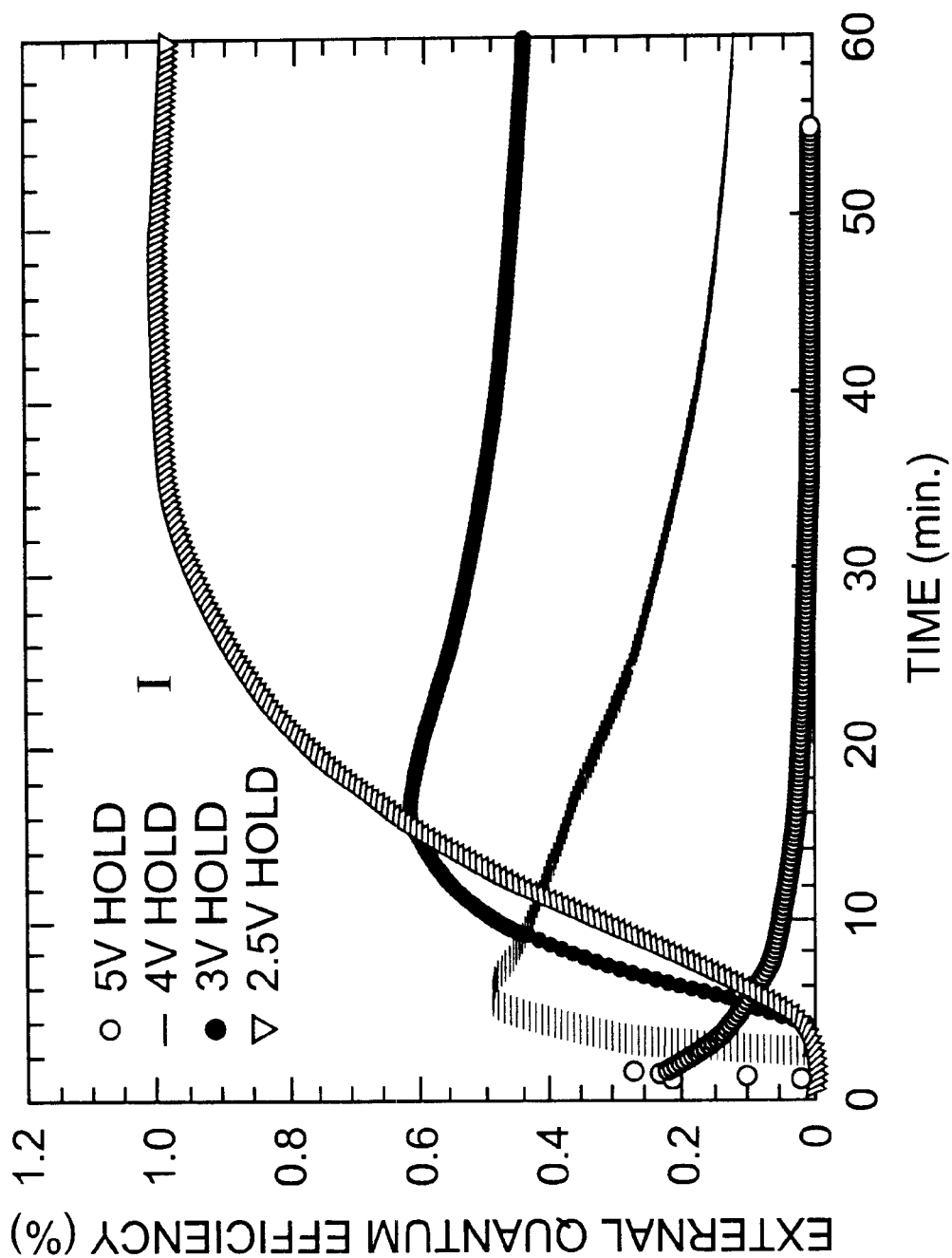
FIG. 4 is a graph depicting device external quantum efficiency as a function of time and applied voltage for a device based on compound I.

Devices including the compound I, shown in FIG. 2, produced luminance levels in the 600–1000 $cd/m^2$ range when biased at 4 or 5V. The luminance levels at 2. 5V, 3V, 4V, and 5V are shown in FIG. 3. The emitted light was red-orange in color ($\lambda_{max}$=630 nm). Luminance levels in excess of 200 $cd/m^2$ were obtained at 3V. The charging time, or time to reach maximum brightness, was about 20 minutes at 3V; the charging time was shortened to 2 minutes with application of 5V to the device. The external quantum efficiency of devices based on compound I varied inversely with applied voltage, and reached a maximum of 1 percent at 2. 5V, as shown in FIG. 4. With regard to device stability, the emitted light intensity at 3V dropped to one-half its maximum value 2 hours after the potential was first applied (i.e., $t_{1/2}$=2 hours). The light intensity exceeded 10 $cd/m^2$ for 40 hours of continuous operation. A $t_{1/2}$ of 5 minutes was observed at 5V.

EXAMPLE 2

Light emitting devices based on underivatized $Ru(bpy)_3$ $(PF_6)_2$, compound II, were prepared by the method described in Example 1. The thickness of the spin-cast film was about 900–1000 Å. The device operated at 400–700 $cd/m^2$ and 0.1–0.3% external quantum efficiency at 3–5V. The light emitted from the device was red-orange. The 3V-$t_{1/2}$ for the device was in the range of 1.5–3 hours.

EXAMPLE 3

Light emitting devices based on an ester-functionalized $Ru(bpy)_3^{2+}$ derivative, compound III, were prepared as described in Example 1. The thickness of the spin-cast film used was about 500–700 Å. When compound III was included in thin film devices, the emitted light was red in color ($\lambda_{max}$=690 nm). Devices based on compound III produced luminance in the 90–900 cd/m² range and operated at 0.2–0.5% external quantum efficiency at 3–5V. The 3V-charging time for devices based on compound III was about 1.5–5 hours, and the 3V-$t_{1/2}$ was about 30–70 hours.

EXAMPLE 4

Figure 5:
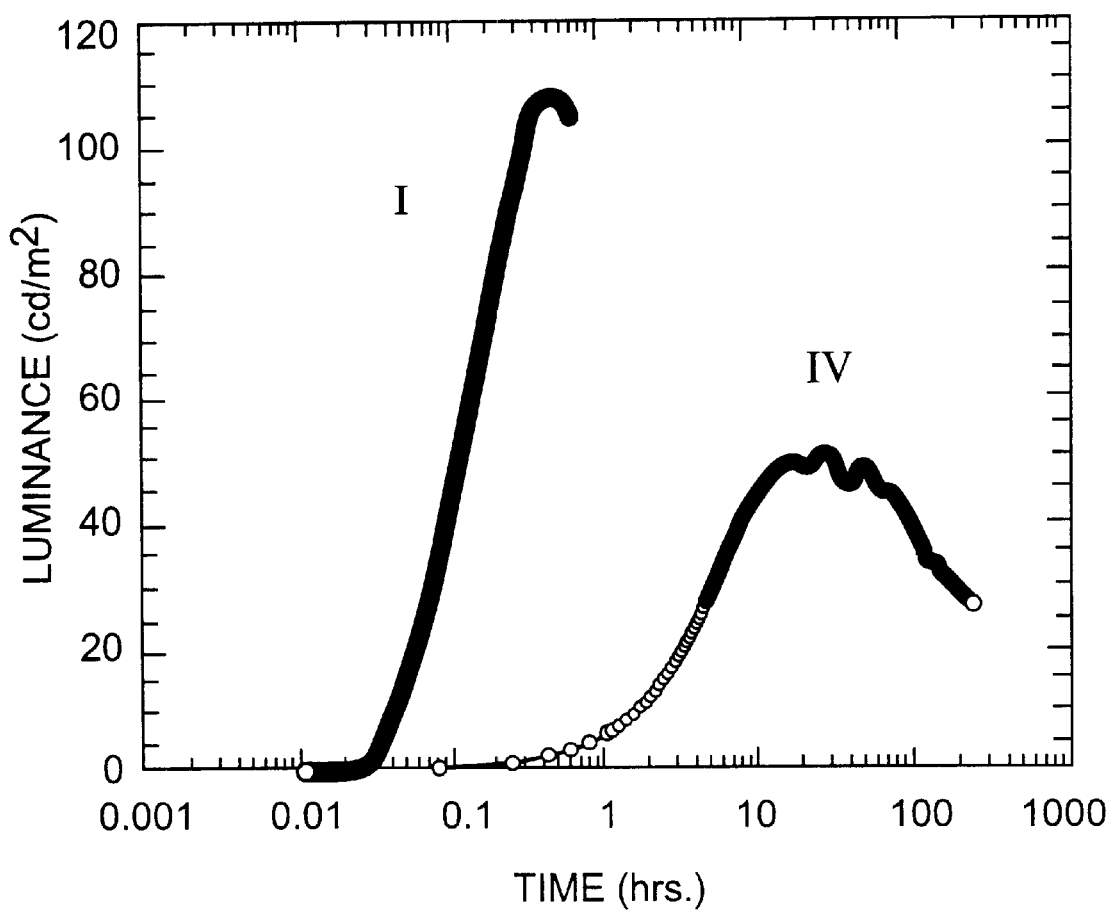
FIG. 5 is a graph depicting light output as a function of time and applied voltage for a device based on compound IV and a device based on compound I.

Light emitting devices based on an ester-functionalized Ru(bpy)$_3^{2+}$ derivative, compound IV, were prepared as described in Example 1, with the following modifications. Prior to the pyridine rinsing step, the ITO substrate used was immersed in 1M hydrochloric acid for 1 minute, then rinsed with H$_2$O. The pyridine solution of compound IV was spun onto the ITO substrate at 1000 rpm. The thickness of the resulting film was about 1800 Å. The device based on compound I (whose performance is shown in FIG. 5) was spin-cast from a 5% (w/w) pyridine solution at 800 rpm, which afforded a film about 1700 Å thick. The ITO substrate was not immersed in hydrochloric acid. A luminance as high as 400 cd/m² was obtained from devices with compound IV at 5V (0.3% external quantum efficiency), and 50 cd/m² at 3V (0.4% external quantum efficiency). The light emitted from the device including compound IV was red in color ($\lambda_{max}$=690 nm). The 3V-charging time was roughly 20 hours. This device including compound IV exhibited a 3V-$t_{1/2}$ of about 240 hours. The 3V luminance over time profile for the device based on compound IV and a device based on compound I are shown in FIG. 5.

EXAMPLE 5

Figure 6:
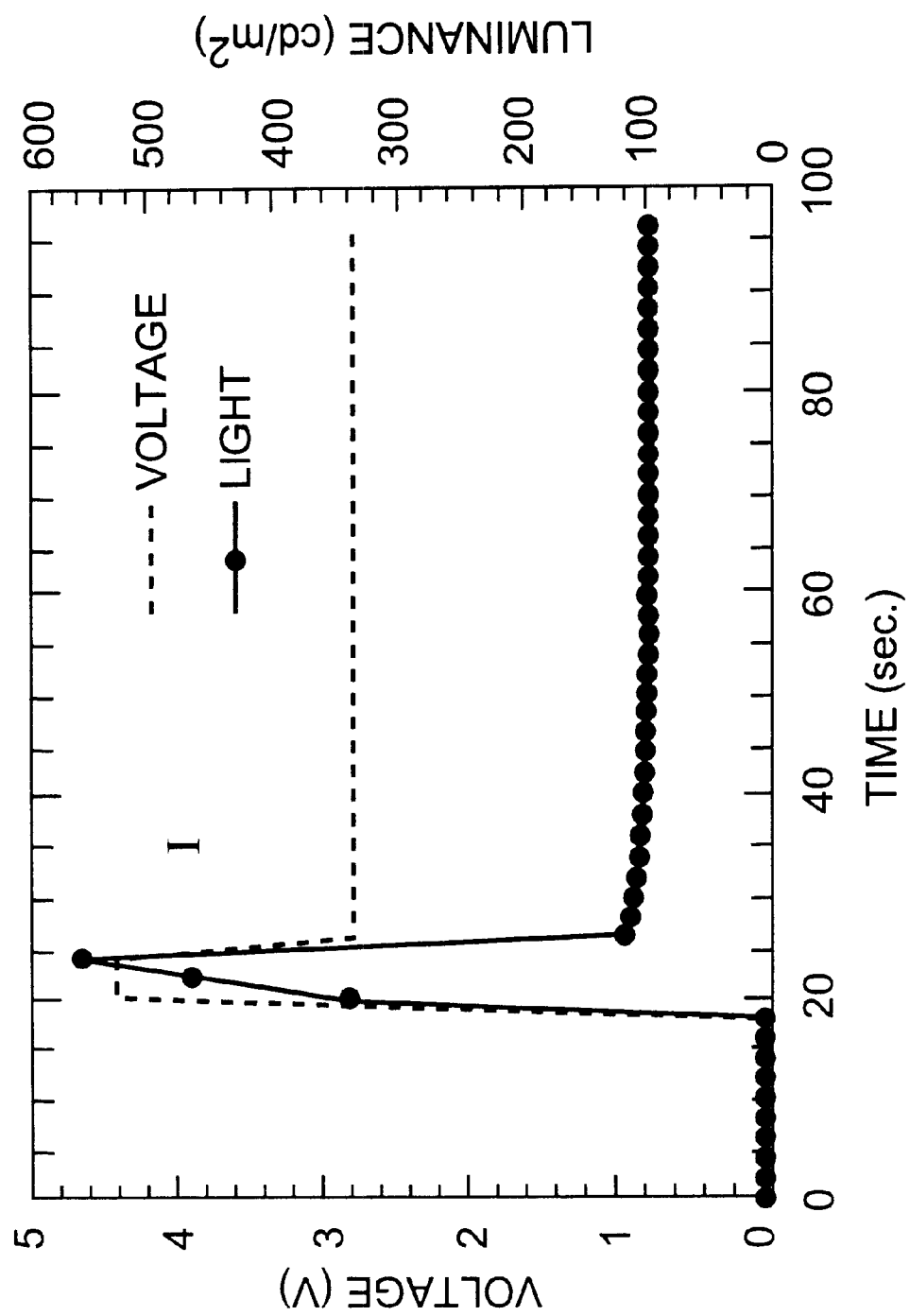
FIG. 6 is a graph depicting light output as a function of time and applied voltage as a function of time for a device based on compound I.

Nearly instantaneous high brightness was achieved from devices prepared as described in Examples 1 and 2. Light of roughly 100 cd/m² was obtained at 2.8 V by applying a short higher-voltage pulse to the device before the constant bias. In this particular example, a 4.4V pulse was applied for 6 seconds to the device based on compound I. The voltage and resulting luminance is shown in FIG. 6. In another example, instantaneous light of 10 cd/m² was obtained at 4V from devices based on compound II by applying a short higher-voltage pulse of 10V for 6 seconds.

EXAMPLE 6

Devices based on compound I remain efficient and stable after going through the pulsing routine used for realizing instantaneous light described in Example 5. A device was pulsed to 5V for 6 seconds, and then held at 2.6V. The efficiency tracked the light emission, rising to 0.9%. After 20 hours of continuous operation, the external quantum efficiency was roughly 0.4% and the emitted light intensity was approximately 10 cd/m².

In addition, devices based on compound II remain efficient and stable after going through the pulsing routine. When the device was pulsed to 5V for 6 seconds and then held at 2.8V, the instantaneous luminance was more than 40 cd/m² and the instantaneous external quantum efficiency was roughly 0.2%. After 120 hours of continuous operation, the emitted light intensity was more than 10 cd/m² and the external quantum efficiency was roughly 0.05%.

EXAMPLE 7

High luminance values can be obtained by treating the ITO anode prior to spin coating. The ITO electrode was etched with 1M hydrochloric acid for 1 minute prior to depositing the solid layer as described in Example 1. With proper treatment of the ITO electrode, luminance in excess of 1200 cd/m² were obtained at 4V from a device based on compound I. The external quantum efficiency reached about 1% at 2.5–3.5 V.

EXAMPLE 8

The performances of spin-cast films of varying thickness was examined. The devices were prepared by a modification of the method of Example 1 using compound I. The ITO electrode was etched with 1 M hydrochloric acid for 1 minute. The film thickness varied from 1300 Å–700 Å. The spin rate was adjusted to change the thickness of the film. By tuning the thickness of the spin-cast film, luminance of 1000 cd/m² was obtained at 3.5 V from a device based on compound I at a thickness of 806 Å. The external quantum efficiency was as high as 1.2% at a thickness of 1080 Å.

EXAMPLE 9

Figure 7:
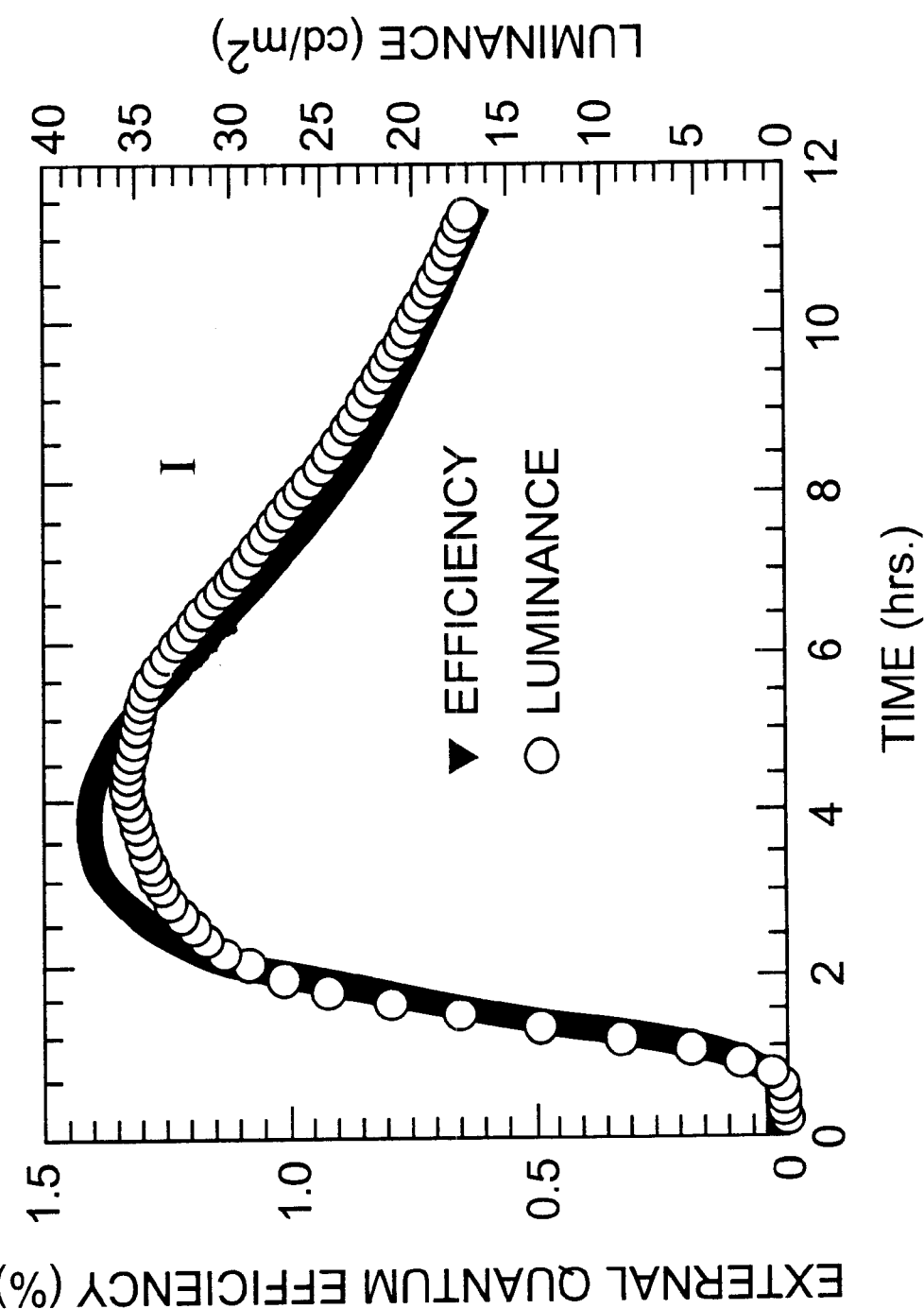
FIG. 7 is a graph depicting the luminance and efficiency as a function of time at 3V for a device based on compound I operated in air at 3V.

The stability of the devices for in-air operation was examined. Devices based on compound I do not need to be operated in a controlled, inert environment to achieve high stability. The device was prepared as described in Example 1. The devices were stored in an air-filled desiccator for several months prior to testing. FIG. 7 depicts the luminance and efficiency as a function of time at 3V for the device operated in air. The device was not encapsulated to protect it from environmental contaminants, such as moisture and oxygen. The emitted light intensity reached 30–40 cd/m², and the 3V-$t_{1/2}$ was 11–12 hours. The maximum efficiency was 1.4%. When operated in air at 4V, a device based on compound I produced luminance of nearly 600 cd/m² at 0.7% efficiency.

Other Embodiments

It is to be understood that while the invention has been described in conjunction with the detailed description thereof, the foregoing description is intended to illustrate and not limit the scope of the claimed invention. For example, other metal complexes, such as platinum or palladium complexes can be used to form the solid layer of the device. In addition, complexes having other polypyridine ligands, such as terpyridine and phenanthroline derivatives can be used to form the solid layer of the light emitting device.

What is claimed is:

1. A solid state light-emitting device comprising:
    a homogeneous non-solvent-swollen-charged solid layer including a metal complex, said solid layer having a first surface and a second surface;
    a first inert electrode in contact with said first surface; and
    a second inert electrode in contact with said second surface;
    wherein said device has a luminance of at least 50 cd/m² at a potential of between 2.5 and 5.0V.

2. The device of claim 1, wherein said metal complex is a transition metal complex.

3. The device of claim 1, wherein said device has a luminance of at least 100 cd/m² at a potential of between 2.5 and 5.0 V.

4. The device of claim 1, wherein said device has a luminance of at least 200 cd/m² at a potential of between 2.5 and 5.0 V.

5. The device of claim 1, wherein said device has an intensity drop to one-half of a maximum intensity at 2.8 V of at least 5 hours.

6. The device of claim 1, wherein said device has an intensity drop to one-half of a maximum intensity at 2.8 V of at least 20 hours.

7. The device of claim 1, wherein said device has an external efficiency of at least 0.5 percent.

8. The device of claim 1, wherein the metal is ruthenium.

9. The device of claim 1, wherein the metal is osmium.

10. The device of claim 1, wherein the metal complex is a bipyridine complex.

11. A solid state light-emitting device comprising:
a solid layer including a metal complex, said solid layer having a first surface and a second surface, wherein the metal complex is a bipyridine complex and the bipyridine has a hydroxymethyl substituent, a C1–18 alkoxycarbonyl substituent, or a hydroxy substituent;
a first inert electrode in contact with said first surface; and
a second inert electrode in contact with said second surface;
wherein said device has a luminance of at least 50 cd/M$^2$ at a potential of between 2.5 and 5.0 V.

12. The device of claim 11, wherein the bipyridine has a C–18alkoxycarbonyl substituent.

13. The device of claim 11, wherein the bipyridine has a hydroxy substituent.

14. A solid state light-emitting device comprising:
a solid layer including a metal complex, said solid layer having a first surface and a second surface, wherein the metal complex is non-polymeric;
a first inert electrode in contact with said first surface; and
a second inert electrode in contact with said second surface;
wherein said device has a luminance of at least 50 cd/m$^2$ at a potential of between 2.5 and 5.0 V.

15. The device of claim 14, wherein the metal complex is a hexafluorophosphate salt of a ruthenium bipyridine complex.

16. The device of claim 1, wherein said first inert electrode is selected from a group consisting of indium tin oxide, aluminum, silver, gold, platinum, and palladium.

17. The device of claim 16, wherein said second inert electrode is selected from a group consisting of indium tin oxide, silver, gold, platinum, palladium, and polypyrrole.

18. A solid state light emitting device comprising a solid layer consisting essentially of a non-polymeric ruthenium bipyridine complex.

19. The device of claim 18, wherein said device has a luminance of at least 50 cd/m$^2$ at a potential of between 2.5 and 5.0 V.

20. A solid state light emitting device comprising a solid layer consisting essentially of a ruthenium bipyridine complex, wherein the bipyridine has a hydroxymethyl substituent, a C1 18 alkoxycarbonyl substituent, or a hydroxy substituent.

21. The device of claim 20, wherein the bipyridine has a C–8 alkoxycarbonyl substituent.

22. The device of claim 20, wherein the bipyridine has a hydroxy substituent.

23. A solid state light emitting device comprising a solid layer including a non-polymeric metal bipyridine complex, said device having a luminance of at least 50 cd/m$^2$ at a potential of between 2.5 and 5.0 V.

24. The device of claim 23, wherein said metal bipyridine complex is a transition metal bipyridine complex.

25. The device of claim 24, wherein the transition metal is ruthenium.

26. The device of claim 23, wherein said device has a luminance of at least 100 cd/M$^2$ at a potential of between 2.5 and 5.0 V.

27. The device of claim 23, wherein said device has an intensity drop to one-half of a maximum intensity at 2.8 V of at least 5 hours.

28. The device of claim 23, wherein said device has an external efficiency of at least 0.5 percent.

29. The device of claim 23, wherein the metal bipyridine complex is a hexafluorophosphate salt of a ruthenium bipyridine complex.

30. A method of generating light comprising:
applying a light-generating potential of between 2.5 and 5.0 V across a first inert electrode and a second inert electrode of a solid state light-emitting device including a solid layer including a metal complex, said solid layer having a first surface and a second surface, said first inert electrode contacting said first surface, and said second inert electrode contacting with said second surface; and
generating light from the device having a luminance of at least 50 cd/m$^2$.

31. The method of claim 30, further comprising the step of applying a charging potential of greater than 5.0 V for less than 30 seconds prior to applying the light-generating potential.

32. The method of claim 30, wherein said metal complex is a transition metal complex.

33. The method of claim 30, wherein the metal is ruthenium.

34. The method of claim 33, wherein the metal complex is a bipyridine complex.

35. A method of generating light comprising:
applying a light-generating potential of between 2.5 and 5.0 V across a first inert electrode and a second inert electrode of a solid state light-emitting device including a solid layer including a metal complex, wherein the metal complex is non-polymeric, said solid layer having a first surface and a second surface, said first inert electrode contacting said first surface, and said second inert electrode contacting with said second surface; and
generating light from the device having a luminance of at least 50 cd/m$^2$.

36. The method of claim 35, wherein the metal complex is a hexafluorophosphate salt of a ruthenium bipyridine complex.

37. The method of claim 36, wherein said light from the device has a luminance of at least 100 cd/m$^2$.

38. The method of claim 36, wherein said light from the device has an intensity drop to one-half of a maximum intensity at 2.8 V of at least 5 hours.

39. The method of claim 36, wherein said device has an external efficiency of at least 0.5 percent.

40. The device of claim 11, wherein the bipyridine has a hydroxymethyl substituent.

41. The device of claim 20, wherein the bipyridine has a hydroxymethyl substituent.

42. A solid state light-emitting device comprising:
an encapsulated solid layer including a metal complex, said solid layer having a first surface and a second surface;
a first inert electrode in contact with said first surface; and
a second inert electrode in contact with said second surface;
wherein said device has a luminance of at least 50 cd/m$^2$ at a potential of between 2.5 and 5.0 V.

* * * * *